United States Patent [19]

Horey et al.

[11] Patent Number: 4,488,300
[45] Date of Patent: Dec. 11, 1984

[54] METHOD OF CHECKING THE INTEGRITY OF A SOURCE OF ADDITIONAL MEMORY FOR USE IN AN ELECTRONICALLY CONTROLLED SEWING MACHINE

[75] Inventors: Leonard I. Horey, West Orange; Marvin Kurland, East Brunswick, both of N.J.

[73] Assignee: The Singer Company, Stamford, Conn.

[21] Appl. No.: 445,814

[22] Filed: Dec. 1, 1982

[51] Int. Cl.³ .............................................. G06F 11/10
[52] U.S. Cl. ....................................... 371/21; 364/900
[58] Field of Search ................. 364/900, 200; 371/21, 371/25

[56] References Cited

U.S. PATENT DOCUMENTS

| | | | |
|---|---|---|---|
| 3,735,105 | 5/1973 | Maley | 371/38 |
| 3,745,316 | 7/1973 | Olah | 371/54 |
| 3,838,264 | 9/1974 | Maker | 371/25 |
| 3,906,460 | 9/1975 | Halpern | 364/900 |
| 4,142,243 | 2/1979 | Bishop | 371/25 |
| 4,355,390 | 10/1982 | Hellwig et al. | 371/21 |
| 4,369,511 | 1/1983 | Kimura et al. | 371/21 |
| 4,430,735 | 2/1984 | Catiller | 371/25 |

Primary Examiner—Jerry Smith
Assistant Examiner—Michael R. Fleming
Attorney, Agent, or Firm—David L. Davis; Robert E. Smith; Edward L. Bell

[57] ABSTRACT

In an electronically controlled sewing machine which has the capability of accepting plug-in modules consisting of read only memories, a method is provided for checking the integrity of the module memory and the means for coupling the memory to the sewing machine controller. The controller reads the first two locations in the memory to check for the presence of alternating patterns of ones and zeros which indicate that shorted or open data lines are unlikely. Another location in the memory contains the number referred to as a checksum. The controller adds the contents of all the other locations of the module memory to this checksum. If the module is undamaged, this sum will be zero. If the sum is not zero, the controller recognizes that a faulty module has been inserted and advises the operator accordingly.

6 Claims, 3 Drawing Figures

1

METHOD OF CHECKING THE INTEGRITY OF A SOURCE OF ADDITIONAL MEMORY FOR USE IN AN ELECTRONICALLY CONTROLLED SEWING MACHINE

BACKGROUND OF THE INVENTION

This invention relates to sewing machines and, more particularly, to electronically controlled sewing machines.

Sewing machines employing sophisticated electronic technology for the storage and subsequent retrieval of stitch pattern information for a multiplicity of patterns have enjoyed great commercial success in recent years. One great advantage of the use of an electronically controlled sewing machine is in its simplicity of operation and control, as perceived by the user. With the recent availability of relatively low cost microcomputers, electronically controlled sewing machine incorporating such a device have greatly increased the versatility of control afforded to the sewing machine operator. However, due to the physical nature of the microcomputer it is limited in its memory capacity so that information for sewing only a preset number of patterns may be stored therein. Accordingly, it would be desirable to increase the memory capacity of an electronically controlled sewing machine. One way of doing this would be to provide a microcomputer having an increased memory capacity. However, this approach suffers from a number of disadvantages. For example, the information stored in the microcomputer is fixed and the only way to change it is to physically replace one microcomputer with another, a job which must be done by a highly skilled technician. A further disadvantage is that in order to provide the operator with a means for addressing all of the patterns stored in the microcomputer without exceeding the space available on the sewing machine for input selection switches, it has been proposed to utilize a numerical input. Unfortunately, such an approach is not desirable because it takes away from the simplicity of operation of the sewing machine which is a highly desirable advantage to the user.

Accordingly, it has been proposed to utilize plug-in modules containing additional patterns or programs to allow the sewing machine to have features which were not originally contained in the machine. The modules consist of read only memories which contain the required software to allow the machine to perform the new features. Unfortunately, since these modules are handled by unskilled consumers, there exists the possibility of the user damaging the module. While proper packaging of the module can minimize the chance of damage, it is important to verify that the contents of the module is undamaged before allowing the software in the module to be used. Additionally, if it is found that the module is damaged, the user should be made aware of the problem and should be prevented from using the module. In addition to the possibility of damage to the memory within the module, there also exists the possibility of damage to the transmission channel between the module and the internal microcomputer, such as may be caused by dirt or the like.

It is therefore a primary object of this invention to provide a method of checking the integrity of such a module as well as the transmission channels between the module and the internal microcomputer.

SUMMARY OF THE INVENTION

The foregoing and additional objects are attained in accordance with the principles of this invention by providing, in an electronically controlled sewing machine having an internal central processor unit for controlling the operation of the sewing machine and means for coupling an external module containing additional memory to the central processor unit, a method of checking the integrity of the additional memory and the coupling means. This method comprises the steps of storing at a first predetermined location in the additional memory a predetermined pattern of data, storing in the central processor unit the same predetermined pattern of data and storing at a second predetermined location in the additional memory checksum data which has a predetermined relationship to the sum of all the data in the additional memory outside the second predetermined location. When the module is plugged into the sewing machine, the contents of the first predetermined location are transmitted to the central processor unit, the transmitted data is compared in the central processor unit with the predetermined pattern of data stored in the central processor unit and a first fault indication is provided in the event the transmitted data and the predetermined pattern of data are not the same. In the event the transmitted data and the predetermined pattern of data are the same, all the data in the additional memory outside the second predetermined location is summed, the summed data is compared with the checksum data, a second fault indication is provided in the event the sum data and the checksum data do not have the predetermined relationship and a verification indication is provided in the event the summed data and the checksum data have the predetermined relationship.

In accordance with an aspect of this invention, the predetermined pattern is a pattern of alternating ones and zeros.

In accordance with a further aspect of this invention, the checksum is the two's complement of the sum of all the other data.

BRIEF DESCRIPTION OF THE DRAWINGS

The foregoing will be more readily apparent upon reading the description in conjunction with the drawings in which like elements in different figures thereof have the same reference character applied thereto and wherein.

DETAILED DESCRIPTION

Figure 1:
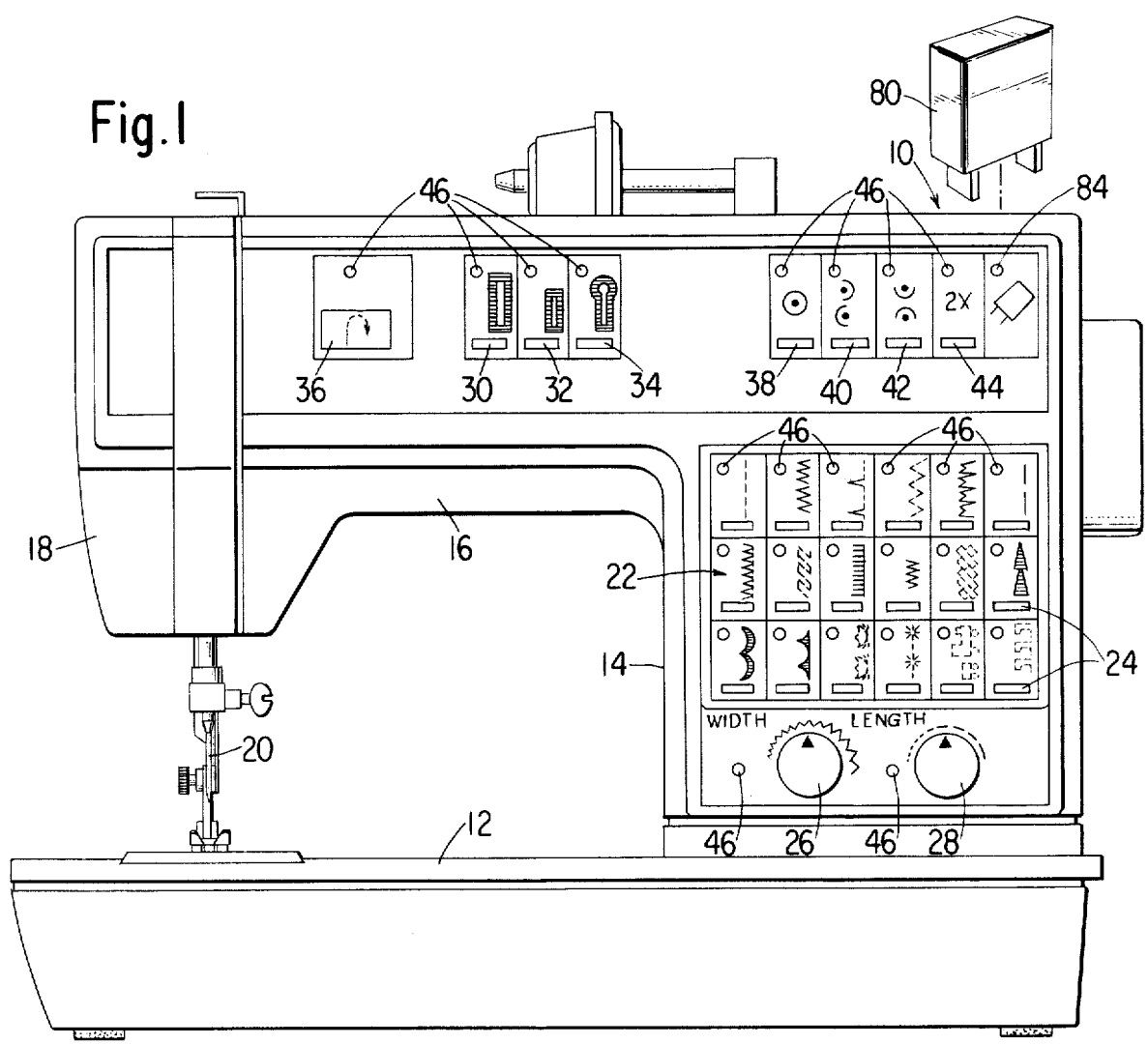
FIG. 1 is a front elevational view of a illustrative sewing machine in which this invention may be incorporated.

Referring now to the drawings, FIG. 1 shows a sewing machine designated generally by the reference numeral 10. The sewing machine 10 includes a work supporting bed 12, a standard 14, a bracket arm 16 and a sewing head 18. The sewing machine stitch forming instrumentalities include a needle 20 capable of being endwise reciprocated and laterally jogged to form zig zag stitches and a work feed dog (not shown) operating upwardly through slots formed in a throat plate on the bed 12 to transport the work across the bed 12 between needle penetrations. The pattern of stitches produced by operation of the sewing machine 10, i.e., the positional coordinates of each stitch penetration, may be influenced, for example, by data stored in a memory unit and extracted in timed relation with the operation of the sewing machine 10, as is well known in the art.

On the front panel of the sewing machine 10 there is provided an input means whereby the operator can effect control of the functions of the sewing machine. This input means includes switches and dials whereby the operator may select a pattern to be sewn by the sewing machine as well as effecting modifications to the pattern. Pattern selection is effected illustratively through an array 22 of push button switches 24, each of which corresponds to a pattern of stitches, the information for forming which is stored within the memory of the sewing machine 10. Associated with each of the push button switches 24 is a pictorial representation of the pattern as it would be sewn by the sewing machine upon actuation of that switch. The input means also includes a stitch width control (bight override) 26 and a stitch length control (feed override) 28. The controls 26 and 28 each includes a push button switch which is operator actuated to effect the respective width or length modification and includes a rotary portion for setting the magnitude of the modification. There are also provided push button switches 30, 32 and 34 for selecting large buttonhole, small buttonhole and eyelet buttonhole patterns, respectively. Single pattern selection is effected via a switch 38. The mirror image of a pattern in the bight direction is selected via the switch 40 and the mirror image of the pattern in the feeding direction is selected via the switch 42. The switch 44 is utilized for doubling the length of a sewn pattern. Indicating means for indicating to an operator the status of each of the various functions which may be selected is also provided on the front panel of the sewing machine 10. Illustratively, this takes the form of a plurality of light emitting diodes (LED's) 46 each in close proximity to its respective input switch.

Figure 2:
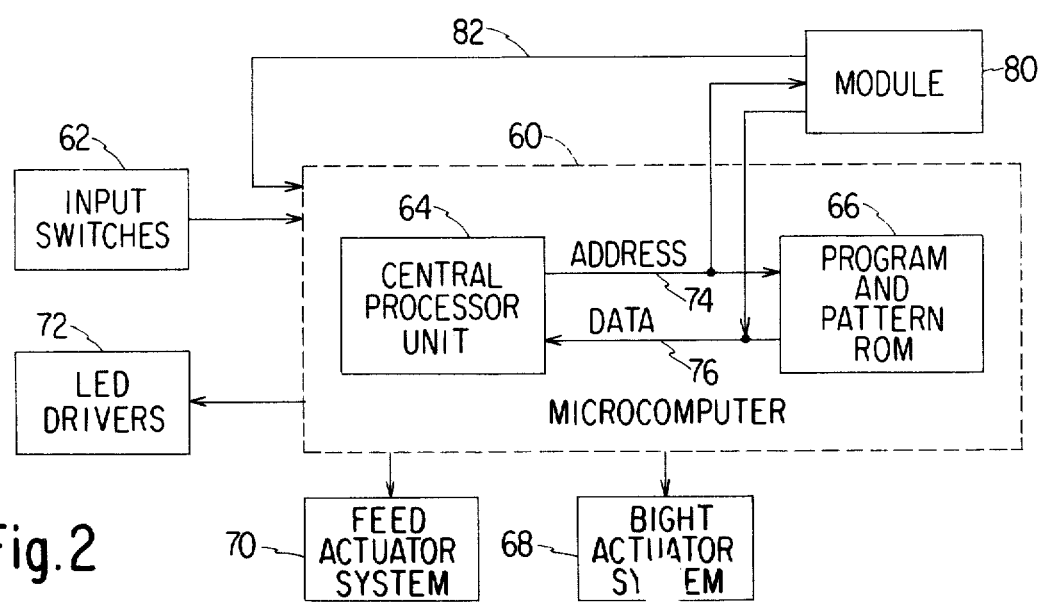
FIG. 2 illustrates a general block diagram of a microcomputer based control system for the sewing machine of FIG. 1.

FIG. 2 shows a general block diagram of a microcomputer based controller for an electronic stitch pattern sewing machine, which controller may be utilized to control the operation of the sewing machine 10 (FIG. 1) and which operates in accordance with the principles of this invention. Accordingly, the microcomputer 60 receives input signals from the input switches 62 indicative of the functions the sewing machine operator desires to be performed by the sewing machine 10. The input switches 62 may include the pattern selection switches 24 and 30-34 as well as the function switches 26, 28, and 36-44. The microcomputer 60 includes an internal central processor unit (CPU) 64 and a program and pattern ROM 66. The CPU 64 obtains from the ROM 66, in timed relation with the operation of the sewing machine 10, pattern data for controlling the bight actuator system 68 and the feed actuator system 70. The bight actuator system 68 and the feed actuator system 70 are similar in construction and are adapted to convert a digital code word from the microcomputer 60 into a mechanical position which locates the sewing machine needle 20 in a conventional stitch forming instrumentality and provides a specific work feed for each needle penetration, respectively, as is well known in the art. The microcomputer 60 also provides signals to the LED drivers 72 to control the illumination of the LED's 46 (FIG. 1) to indicate the function selected by the sewing machine operator. Illustratively, the microcomputer 60 is a type TMS 7040 microcomputer manufactured by Texas Instruments wherein the CPU 64 provides addresses to the ROM 66 over the bus 74 and receives in return bytes of data and program over the bus 76. In addition to the ROM 66, the microcomputer 60 also includes read/write memory and registers which the CPU 64 utilizes during execution of its internal program stored in the ROM 66.

In order to enable the functional capability of the sewing machine 10 to be expanded, the sewing machine 10 is provided with a receptacle (not shown) for accepting a plug-in module 80. The plug-in module 80 includes a ROM which stores software and pattern data which is substituted for software and pattern data stored in the ROM 66, so that actuation of the push button switches 24 causes respective patterns stored in the module 80 to be sewn instead of those stored in the ROM 66. As shown in FIG. 2, when the module 80 is plugged into its receptacle, it is coupled to the address bus 74 and the data bus 76 within the microcomputer 60. Additionally, a separate line 82 is provided as an input to the microcomputer 60, the line 82 being grounded when the module 80 is inserted into its receptacle. The sewing machine 10 is also provided with an LED 84 associated with a pictorial representation of the module 80. When the module 80 is plugged into its receptacle, the LED 84 is utilized, in accordance with the principles of this invention, to provide an indication to the sewing machine operator as to whether the module 80 is usable. Thus, for example, if the module 80 is usable, the LED 84 is continuously lit or, alternately, if the module 80 is not usable the LED 84 is caused to blink. Alternatively, a suitable audible indication may be provided if the module 80 is not usable.

It order to enable the microcomputer 60 to verify the integrity of the module 80, the ROM within the module 80 contains certain defined information therein. In particular, the first two bytes of the module have stored therein patterns of alternating ones and zeros. The proper receipt of these patterns by the central processor unit 64 indicates that shorted or opened data lines are unlikely. The third byte of the module indicates the size of the ROM, which must be between 256 and 8K bytes in 256 bytes increments. Accordingly, this information must be less than 32. The last three bytes of the module ROM contain a number which is called a checksum. This checksum is the two's complement of the sum of all the other bytes in the module ROM. The central processor unit 64 adds the contents of all the other bytes of the module ROM to the checksum. If the module is undamaged, the resulting sum will be zero.

Figure 3:
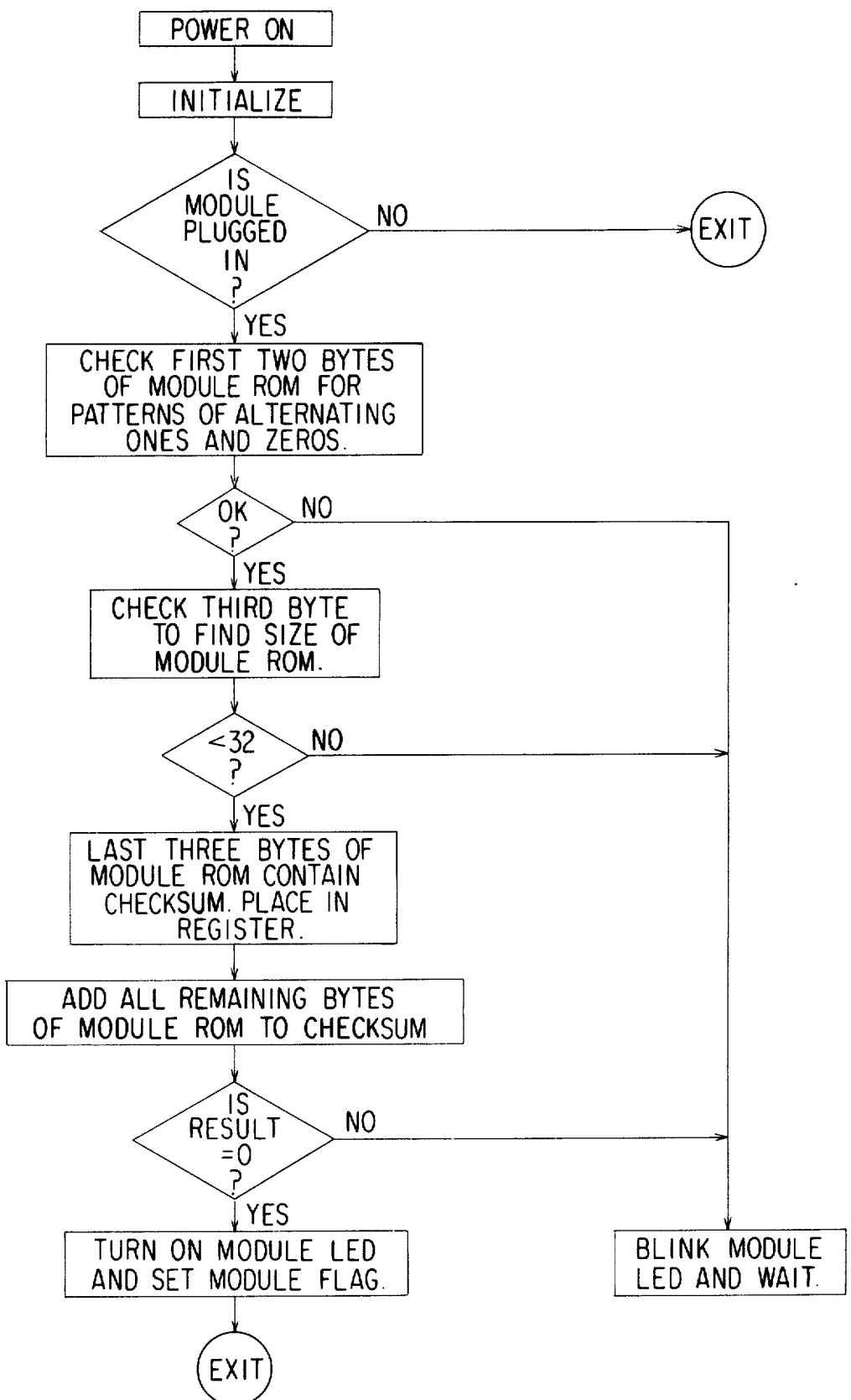
FIG. 3 is a flow chart of a program for operating the microcomputer of FIG. 2 in accordance with the principles of this invention.

The Appendix to this specification illustrates a program for operating the microcomputer 60 to verify the integrity of a module ROM, as discussed above. This program is written in assembly language for the TMS 7040 microcomputer. FIG. 3 is a flow chart for the program set forth in the Appendix.

It is to be initially noted that the module 80 is to be inserted into its receptacle only when power is not being applied to the sewing machine. As shown in FIG. 3, after power is applied the central processor unit 64 goes through an initialization routine to clear registers, etc., as is well known in the art. Next, the central processor unit 64 checks the status of the lead 82 to determined whether a module has been plugged into its receptacle. If not, the CPU 64 exits the subroutine. If a module is plugged in, the first two bytes of the module ROM are checked for patterns of alternating ones and zeros. Illustratively, the first pattern is of the form 1010 and the second pattern is of the form 0101. If the CPU receives the proper patterns, this is an indication that shorted or open data lines between the CPU 64 and the module 80 do not exist. If the appropriate patterns are not received, the LED 84 is caused to blink. Upon receipt of the appropriate patterns of alternating zeros and ones, the CPU 64 examines the third byte of the module ROM to find its size. The number stored in this third byte should be less than 32. If not, the LED 84 is caused to blink. If the number is less than 32, the last three bytes of the module ROM are placed within a register of the CPU 64. These last three bytes form a checksum and all remaining bytes of the module ROM are added to this checksum. If the final result does not equal zero, this indicates a faulty ROM and the LED 84 is caused to blink. If the result is zero, this indicates that the ROM is a good ROM. Accordingly, the CPU 64 causes the LED 84 to be steadily lit and the module flag within the CPU 64 is set to indicate to the CPU 64 that software and pattern data within the module ROM should be utilized in place of software and pattern data within the ROM 66. In the event of a bad module ROM, in addition to causing the LED 84 to blink, the CPU 64 ignores all user inputs. This indicates to the user that a bad module is present and that the machine should be turned off and the module removed.

Accordingly, there has been disclosed a method of checking the integrity of a plug-in memory. It is understood that the above-described method is merely illustrative of the application of the principles of this invention. Numerous other methods may be devised by those skilled in the art without departing from the spirit and scope of this invention, as defined by the appended claims.

METHOD OF CHECKING THE INTEGRITY OF A SOURCE OF ADDITIONAL MEMORY FOR USE IN AN ELECTRONICALLY CONTROLLED SEWING MACHINE

APPENDIX

```
0957           *
0958           *
0959           * DETERMINE IF EXTERNAL MEMORY IS PRESENT.
0960           * SET MODULE FLAG IF A VALID MODULE IS PRESENT.
0961           *
0962  03AB  A6  CHKMEM BTJOP  %>20,PORTA,NOMEM1   IF BIT IS SET, THEN NO MODULE
      03AC  20
      03AD  04
      03AE  5B
0963           *
0964           * MODULE IS PLUGGED IN.  MAKE SURE ITS OK.
0965           *
0966  03AF  8A          LDA   @EXTROM
      03B0  A000
0967  03B2  2D          CMP   %>AA,A              THE FIRST BYTE SHOULD BE AA
      03B3  AA
0968  03B4  E6          JNE   NOMEM
      03B5  5F
0969  03B6  8A          LDA   @EXTROM+1
      03B7  A001
0970  03B9  2D          CMP   %>55,A              THE 2ND BYTE SHOULD BE 55
      03BA  55
0971  03BB  E6          JNE   NOMEM
      03BC  58
0972  03BD  8A          LDA   @EXTROM+2
      03BE  A002
0973  03C0  2D          CMP   %32,A
      03C1  20
0974  03C2  E3          JC    NOMEM               THE 3RD BYTE MUST BE <32
      03C3  51
0975           *
0976           * THE FIRST THREE BYTES LOOK OK.  THE LAST THREE BYTES CONTAIN THE
0977           * TWO'S COMPLEMENT OF THE SUM OF ALL OF THE OTHER BYTES IN THE ROM.
0978           * CHECK THE SUM AND MAKE SURE THE RESULT SUMS TO ZERO.
0979           *
0980  03C4  28          ADD   %>A0,A
      03C5  A0
0981  03C6  D0          MOV   A,IABFM2            USE IABFM2 & IABFL2 AS ADDR POINTER
      03C7  71
0982  03C8  72          MOV   %>FF,IABFL2         (STRINGING CAN'T BE ACTIVE DURING
      03C9  FF
      03CA  72
0983           *                                   THIS TIME)
0984  03CB  9A          LDA   *IABFL2
      03CC  72
0985  03CD  36          XCHB  A
0986  03CE  D2          DEC   IABFL2
      03CF  72
0987  03D0  9A          LDA   *IABFL2
      03D1  72
0988  03D2  D0          MOV   A,SUM1
      03D3  41
0989  03D4  D2          DEC   IABFL2
      03D5  72
0990  03D6  9A          LDA   *IABFL2
      03D7  72
0991  03D8  D0          MOV   A,SUM2
```

```
                                                * SUM THE CONTENTS OF THE ROM PAGE 0996  03DC  9A    SUMLOP  LDA    *IABFL2
      03DD  72
0997  03DE  38            ADD    R0,B
      03DF  00
0998  03E0  79            ADC    %0,SUM1
      03E1  00
      03E2  41
0999  03E3  79            ADC    %0,SUM2
      03E4  00
      03E5  42
1000  03E6  DA    SUMDEC  DJNZ   IABFL2,SUMLOP
      03E7  72
      03E8  F3

* LS BYTE OF ADDR POINTER IS 0; CHECK IF FINISHED 1004  03E9  9A            LDA    *IABFL2
      03EA  72
1005  03EB  38            ADD    R0,B
      03EC  00
1006  03ED  79            ADC    %0,SUM1
      03EE  00
      03EF  41
1007  03F0  79            ADC    %0,SUM2
      03F1  00
      03F2  42
1008  03F3  7D            CMP    %>A0,IABFM2
      03F4  A0
      03F5  71
1009  03F6  E2            JEQ    SUMFIN
      03F7  04

1010
1011  03F8  D2            DEC    IABFM2           NOT DONE, SUM NEXT PAGE
      03F9  71
1012  03FA  E0            JMP    SUMDEC
      03FB  EA

* MEMORY HAS BEEN SUMMED, RESULT SHOULD BE 0.

1017  03FC  34    SUMFIN  OR     SUM1,B
      03FD  41
1018  03FE  34            OR     SUM2,B
      03FF  42
1019  0400  F6            JNE    NOMEM            IF ANY OF THE SUM BYTES IS NON-ZERO,
      0401  13                                    THEN MEMORY IS NO GOOD, SO IGNORE IT.

* MEMORY IS OK, MODULE IS VALID SO SET FLAG. DISABLE INTERRUPTS
                                                * IF A VALID MODULE IS PRESENT. INTS WILL BE RE-ENABLED AFTER
                                                * THE MODULE'S INIT ROUTINE HAS BEEN CALLED.

1026  0402  52            MOV    %MODLED,B
      0403  1E
1027  0404  E8            TRAP   LEDON            TURN ON MODULE LED
      0405  06
1028  0405  06            DINT
1029  0406  72            MOV    %>01,MODULE
      0407  01
      0408  70
1030  0409  0A            RETS

* THERE IS NO MODULE, ALLOW DRIVE MOTOR TO RUN.

1034  040A  06    NOMEM1  DINT
1035  040B  74            OR     %MTR700,PORTG2
      040C  04
      040D  67
1036  040E  12            MOV    PORTG2,A
      040F  67
1037  0410  88            STA    @PORTG
      0411  0000
1038  0413  05            EINT
1039  0414  0A            RETS

* THE MODULE IS NO GOOD. BLINK THE MODULE LED &
                                                * CONTINUE TO UPDATE THE S/H. IGNORE THE BUTTONS.

1046  0415  05    NOMEM   CLR    T8MIL
      0416  73
1047  0417  06    WAITOF  DINT
1048  0418  EC            TRAP   OUTDAT
1049  0419  05            EINT
1050  041A  22            MOV    %11,A
      041B  0B
1051  041C  8A    WAIT1   DJNZ   A,WAIT1          WASTE TIME
      041D  FE
1052  041E  12            MOV    T8MIL,A
      041F  43
1053  0420  F6            JNE    WAITOF
      0421  F5
1054  0422  72            MOV    %HAFSEC,T8MIL
      0423  3E
      0424  73
1055  0425  52            MOV    %MODLED,B
```

```
      0426  1E
1056  0427  E8          TRAP  LEDON
1057              *
1058  0428  06   WAITON DINT
1059  0429  EC          TRAP  OUTDAT
1060  042A  05          EINT
1061  042B  22          MOV   $11,A
      042C  0B
1062  042D  BA   WAIT2  DJNZ  A,WAIT2              WASTE TIME
      042E  FE
1063  042F  12          MOV   T8MIL,A
      0430  43
1064  0431  E6          JNE   WAITON
      0432  F5
1065  0433  72          MOV   $HAFSEC,T8MIL
      0434  3E
      0435  73
1066  0436  52          MOV   $MODLED,B
      0437  1E
1067  0438  E9          TRAP  LEDOFF
1068  0439  E0          JMP   WAITOF
      043A  0C
```

We claim:

1. In an electronically controlled sewing machine having an internal central processor unit for controlling the operation of the sewing machine and means for coupling an external module containing additional read only memory to said central processor unit, a predetermined pattern of data being stored both in said central processor unit and at a first predetermined location in said additional memory, and said additional memory having stored therein at a second predetermined location checksum data which has a predetermined relationship to the sum of all the data in said additional memory outside said second predetermined location, a method of checking the integrity of said additional memory and said coupling means, said method comprising the steps of:

transmitting the contents of said first predetermined location to said central processor unit;

comparing in said central processor unit the transmitted data with said predetermined pattern of data stored in said central processor unit;

providing a first fault indication in the event the comparing step reveals that the transmitted data and the predetermined pattern of data are not equal;

summing in said central processor unit all the data in said additional memory outside said second predetermined location in the event the transmitted data and the predetermined pattern of data are equal;

determining in said central processor unit whether the summed data has said predetermined relationship to the checksum data;

providing a second fault indication in the event the summed data and the checksum data are determined to not have said predetermined relationship; and providing a verification indication in the event the summed data and the checksum data are determined to have said predetermined relationship.

2. The method according to claim 1 wherein said predetermined pattern of data is a pattern of alternating ones and zeros.

3. The method according to claim 2 wherein said predetermined pattern of data comprises a first pattern of the form 1010 and a second pattern of the form 0101.

4. The method according to claim 1 wherein said checksum data is the two's complement of the sum of all the data in said additional memory outside said second predetermined location.

5. The method according to claim 4 wherein the step of summing includes summing the checksum data with the summed data and the step of determining includes checking whether the summed checksum data and summed data equals zero.

6. The method according to claim 1 wherein at a third predetermined location in said additional memory there is stored data indicative of the size of said additional memory and wherein said second predetermined location in said additional memory is a fixed number of bytes at the end of said additional memory.

* * * * *